United States Patent [19]

Tanimura et al.

[11] 4,011,577
[45] Mar. 8, 1977

[54] MECHANICAL-ELECTRICAL FORCE TRANSDUCER WITH SEMICONDUCTOR-INSULATING LAYER-TIN OXIDE COMPOSITE

[75] Inventors: Shigeru Tanimura, Kyoto; Nobuyuki Yamamura, Takatsuki; Masanobu Koide, Kyoto, all of Japan

[73] Assignee: Omron Tateisi Electronics Co., Kyoto, Japan

[22] Filed: Dec. 10, 1974

[21] Appl. No.: 531,447

Related U.S. Application Data

[63] Continuation of Ser. No. 342,392, March 19, 1973, abandoned.

[30] Foreign Application Priority Data

Mar. 21, 1972 Japan .................................. 47-28788

[52] U.S. Cl. .................................. 357/26; 357/15; 357/67; 357/71
[51] Int. Cl.[2] .................. H01L 29/84; H01L 29/96; H01L 29/48; H01L 29/56
[58] Field of Search .................. 357/15, 17, 26, 67, 357/71

[56] References Cited

UNITED STATES PATENTS

| | | | |
|---|---|---|---|
| 3,106,489 | 10/1963 | Lepselter | 357/67 |
| 3,369,132 | 2/1968 | Fang et al. | 357/17 |
| 3,398,021 | 8/1968 | Lehrer et al. | 357/15 |
| 3,457,473 | 7/1969 | Okada et al. | 357/15 |
| 3,611,068 | 10/1971 | Fujita | 357/26 |
| 3,787,718 | 1/1974 | Patterson | 357/26 |
| 3,790,869 | 2/1974 | Tanimura et al. | 357/15 |
| 3,872,490 | 3/1975 | Higashi et al. | 357/15 |

OTHER PUBLICATIONS

Metal-Dependent Interface States in Thin MOS Structures by Kar et al., Applied Physics Letters, vol. 18, No. 9, May 1, 1971, pp. 401–403.
Solid State Electronics, *Metal-Silicon Schottky Barrier*, by M. J. Turner et al., vol. 11, pp. 291–300, Mar. 1968.

*Primary Examiner*—Andrew J. James
*Attorney, Agent, or Firm*—Staas & Halsey

[57] ABSTRACT

A semiconductor mechanical-electrical transducer is obtained by providing a mechanical force applying means on a semiconductor composite comprising a semiconductor substrate, an insulating film formed on said semiconductor substrate and a film of tin oxide deposited on said insulating film and having a barrier having a rectifying characteristic. Preferably, the material of said insulating film may be selected from a group consisting of $SiO_2$, $Si_3N_4$ and $GeO_2$ and the thickness of the film may be chosen to be 15 to 80A, but preferably to be 20 to 60A and more preferably to be 20 to 40A. It was discovered that such composite shows an increased reverse current response to mechanical force applied to the composite in case where the thickness of the $SiO_2$ film has been chosen to the said particular value range. Preferably, the main surface of the substrate is made uneven. It was also discovered that in such an embodiment a shearing stress is applied to the barrier, when the mechanical force is applied to the composite, in which case the conversion efficiency of the energy is enhanced as compared with a case where the main surface has been mirror-polished.

30 Claims, 16 Drawing Figures

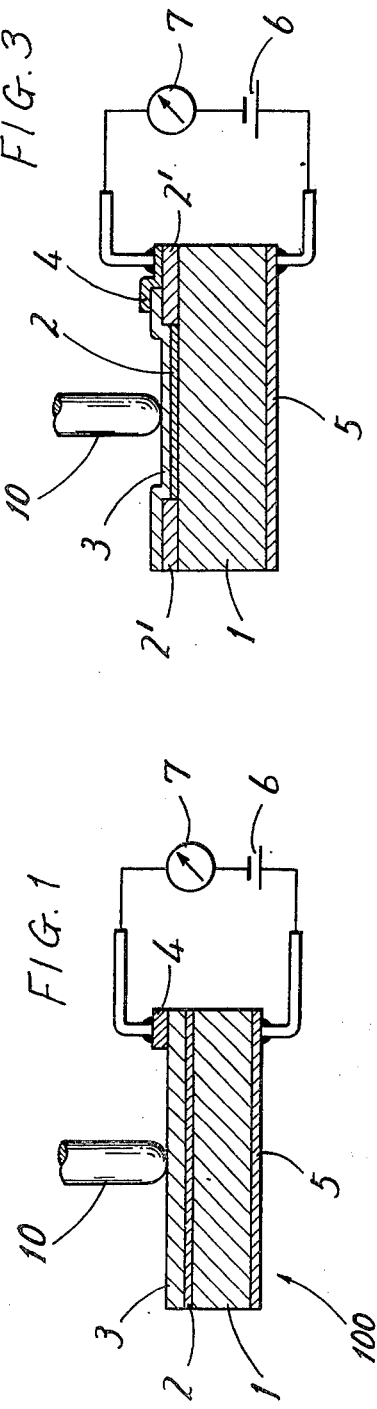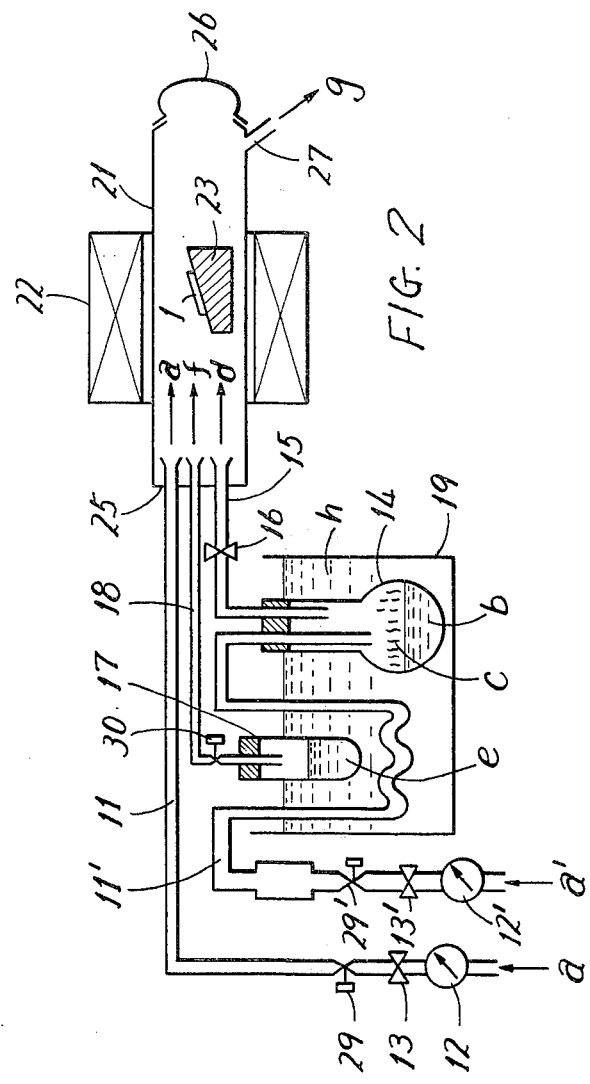

MECHANICAL-ELECTRICAL FORCE TRANSDUCER WITH SEMICONDUCTOR-INSULATING LAYER-TIN OXIDE COMPOSITE

This is a continuation of application Ser. No. 342,392, filed Mar. 19, 1973, now abandoned.

BACKGROUND OF THE INVENTION

1. Field of the Invention

The present invention relates to a semiconductor transducer. More specifically, the present invention relates to a semiconductor mechanical-electrical transducer utilizing a semiconductor composite comprising a tin oxide film deposited on a semiconductor substrate and having a rectifying characteristic.

2. Description of the Prior Art

Various types of semiconductor mechanical-electrical transducers or semiconductor pressure sensitive transducers have been proposed and put to practical use. A typical type of such transducers uses a semiconductor P-N junction. A semiconductor device, typically made of silicon, having a P-N junction undergoes a change of the electrical characteristic of the junction, when mechanical force or pressure is applied to the P-N junction. It is, therefore, possible to implement a pressure sensitive device by providing a means for applying pressure to the P-N junction of a semiconductor device having such junction.

One of the problems of the conventional pressure sensitive transducers employing the P-N junction is that the pressure sensitivity is low. For this reason it is necessary to combine such transducer with an active device such as a transistor, in case it is put to practical use. Another great problem is poor linearity of the electrical characteristic, this limiting applications of such a transducer. Also it is well known to those skilled in the art that semiconductor devices employing a P-N junction call for treatment at a high temperature in the process of manufacture thereof, with the result that the manufacturing process is complicated and costly.

Another type of pressure sensitive transducer was also proposed, which employs a Schottky barrier formed between a semiconductor layer and a metal layer. One of the problems encountered in this type of transducer is that the barrier is subject to damage when mechanical force or pressure is applied to the metal layer due to the fact that the metal layer employed in such transducer is relatively soft.

A prior art of interest which discloses a basic structural feature of the present invention is U.S. Pat. No. 3,679,949, entitled "SEMICONDUCTOR HAVING TIN OXIDE LAYER AND SUBSTRATE", issued July 25, 1972 to Genzo Uekusa et al. and assigned to the same assignee of the present invention. The referenced patent basically discloses a semiconductor composite comprising a film of tin oxide ($SnO_2$) deposited on a semiconductor substrate such as silicon and having a rectifying and photoelectric characteristic therebetween. More specifically, the referenced patent discloses such a composite obtained by a process comprising the steps of heating an N-type silicon single crystal substrate in a quartz tube, introducing a vapor of a tin salt such as dimethyl tin dichloride (($CH_3)_2SnCl_2$) into said quartz tube and having a tin oxide film deposited on said silicon substrate by pyrolysis. Such a composite comprises a barrier formed between the tin oxide film and the silicon substrate, which barrier is presumably a Schottky barrier and closely resembles a P-N junction in a rectifying characteristic. Such a barrier may be advantageously utilized as a rectifying device or photoelectromotive device. As is well known, a tin oxide film is transparent and conductive. Hence, by so adapting the composite that light is applied to said barrier through the tin oxide film, a photoelectric device is provided. The spectral characteristic of such a photoelectric device is such that it is more highly sensitive in the visible wavelength region as compared with a conventional silicon photoelectric device. It also exhibits a higher output at lower illumination, and is satisfactory in temperature and response characteristics. Another advantage of the referenced patent composite is that the composite can be easily manufactured at low cost on a mass production basis in view of the fact that the tin oxide layer may be deposited at a lower temperature as compared with a process employed in manufacture of a silicon photoelectric device.

Preferably silicon is employed as a semiconductor substrate material in maufacturing the referenced patent composite. It should be pointed out, however, that the surface of the silicon substrate is likely to be oxidized even at a normal temperature and as a result the silicon substrate as prepared for manufacture of semiconductor devices usually comprises a thin oxide film formed on the surface thereof. Such oxide film typically comprises $SiO_2$. Again it should be pointed out that an additional oxide film is formed on the surface of the substrate in the course of further depositing a tin oxide film on the surface. As a result it was found that the semiconductor composite prepared in accordance with the teaching in the said referenced patent usually comprises a very thin insulating film, typically of $SiO_2$, of a thickness of a few A to approximately 10A incidentally formed between the tin oxide film and the substrate. Thus it would be readily understood that such undesired intervening layer of insulating film is inevitably formed, unless consideration is given to eliminate such undesired layer.

With a view to investigating in detail what influence the $SiO_2$ layer incidentally formed between the $SnO_2$ layer and the Si substrate has upon performance of the $SnO_2$—Si heterojunction of the composite, the inventors of the present application first removed the $SiO_2$ layer formed on the substrate surface through natural oxidization of the substrate material and then deposited an $SnO_2$ layer on the fresh surface of the substrate by a process and a means for eliminating formation of an $SiO_2$ layer on the substrate surface during deposition of the $SnO_2$ layer, so that a new composite can be provided, which comprises no substantial $SiO_2$ layer between the $SnO_2$ layer and the substrate of the composite. As a result, it was observed that the resultant $SnO_2$—Si composites are non-uniform in a reverse breakdown voltage, are of an increased reverse leakage current and of a lowered reverse breakdown voltage. As well known to those skilled in the art, these changes in characteristics of the referenced patent composite are all disadvantageous in various applications of the semiconductor device. This the fact was confirmed that formation of the $SiO_2$ film at a junction region of the $SnO_2$—Si composite has not a little influence upon the characteristic of the semiconductor device.

Nevertheless, the fact was also confirmed by experiment that the thickness of the $SiO_2$ film incidentally formed in the $SnO_2$—Si composite manufactured in accordance with the teaching in the referenced patent does not exceed 15A. It is believed that usually such a very thin $SiO_2$ layer does not cover the whole surface of the silicon substrate or rather the substrate surface is studded with a plurality of small $SiO_2$ film areas with irregularities of the film thickness and other film conditions. For this reason it is hardly possible to provide $SnO_2$—Si composites of uniformity in characteristic as a semiconductor device, resulting in unsatisfactory yield rate of manufacture of the device.

Apart from the above discussion as regards the incidental formation of the $SiO_2$ film between the $SnO_2$ layer and the Si substrate, because of the abovementioned photoelectric and rectifying characteristic features of the referenced patent device, the referenced patent discloses and teaches application of the device as a photoelectric device and a rectifying device. However, the referenced patent neither teaches nor suggests a response to the mechanical force or pressure applied to the device disclosed therein and application of the device as a pressure sensitive semiconductor device. In fact, it should be pointed out that in view of transparency of the tin oxide film of the device a different application of the device would never be thought of by those skilled in the art.

SUMMARY OF THE INVENTION

Briefly stated, the present invention provides a semiconductor mechanical-electrical transducer comprising a semiconductor composite comprising a semiconductor substrate, an insulating film formed on said semiconductor substrate and a film of a tin oxide, preferably stannic oxide ($SnO_2$), deposited on said insulating film and having a barrier having a rectifying characteristic, and a means for applying mechanical force to said composite. Preferably the material of said semiconductor substrate may be selected from the group consisting of Si, Ge, and GaAs. Preferably, a material of said insulating film may be selected from the group consisting of $SiO_2$, $Si_3N_4$ and $GeO_2$. The thickness of the insulating film may be chosen to be 15A to 80A, but preferably the thickness of the insulating film may be chosen to be 20A to 60A and more preferably to be 20A to 40A.

It was discovered that such a composite shows a change in the electrical characteristic, when mechanical force is applied to the composite. More specifically, the reverse current of the composite is linearly proportional to the mechanical force applied to the composite. It was also discovered that such a composite shows an increased reverse current response to the mechanical force applied to the composite and an increased ratio of such reverse current of the device under certain value of pressure versus that in case of no pressure, in case where the thickness of the $SiO_2$ film has been chosen to the said particular value range.

The present invention also provides an improvement in such transducer, wherein pressure sensitivity is enhanced. This can be accomplished by employing such structure that mechanical force is applied so as to give rise to a shearing stress in the barrier portion. In accordance with an embodiment employing such an improvement an insulating film and a tin oxide layer are deposited on an uneven surface or a surface having small irregularities of a semiconductor substrate. Accordingly, the interface or barrier formed therebetween has corresponding irregularities or unevenness. When mechanical force is applied to a given area of the tin oxide layer, there occurs a shearing stress in the interface or barrier of a bevel portion. It was discovered that, when the barrier portion is thus subjected to a shearing stress, higher pressure sensitivity is obtained as compared with a case where mechanical force is applied vertically to the barrier or the barrier protion is subjected to a compressive stress.

Therefore, an object of the present invention is to provide a pressure sensitive device of novel structure having an excellent pressure sensitive characteristic.

Another object of the present invention is to provide an improved pressure sensitive device having a pressure sensitivity characteristic which comprises an $SnO_2$ film deposited on a semiconductor substrate.

A further object of the present invention is to provide a semiconductor mechanical-electrical transducer comprising an $SnO_2$ layer deposited on semiconductor substrate, with an insulating film of a specific thickness intervening therebetween.

Still a further object of the present invention is to improve a pressure sensitivity characteristic of the pressure sensitive device employing a semiconductor composite comprising an $SnO_2$ layer deposited on a semiconductor substrate, with an insulating film of a specific thickness intervening therebetween.

These and other objects and features of the present invention will be better understood from the following detailed description in conjunction with the accompanying drawings.

BRIEF DESCRIPTION OF THE DRAWINGS

FIG. 1 shows a sectional view of a semiconductor mechanical-electrical transducer in accordance with the present invention, FIG. 2 shows a preferred arrangement of an apparatus for manufacture of the composite shown in FIG. 1, FIG. 3 shows a sectional view of a semiconductor mechanical-electrical transducer of a preferred embodiment of the present invention.

In all these figures like reference characters designate like parts.

DESCRIPTION OF THE PREFERRED EMBODIMENTS

Figure 4:
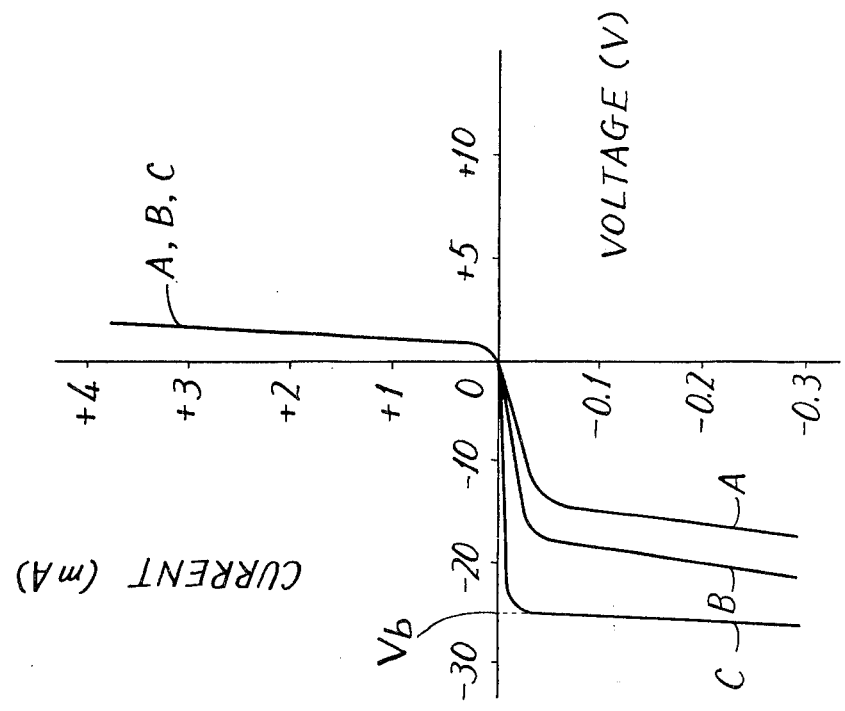
FIG. 4 is a graph showing a comparison of the characteristic of a semiconductor composite of the present invention with that of the prior art composite.

Referring to FIG. 1, there is shown a schematic sectional view of a mechanical-electrical transducer of an embodiment in accordance with the present invention. The transducer shown basically comprises a semiconductor composite 100 and a pressure applying means 10 provided thereon.

The composite 100 shown basically comprises an N-type single crystal silicon substrate 1 with specific resistivity of 1 ohm cm, a layer 2 of silicon dioxide ($SiO_2$) formed on the said sutstrate 1, and a layer 3 of tin oxide or stannic oxide ($SnO_2$) further deposited on the said $SiO_2$ layer 2. The composite is also shown comprising a metal electrode 4 formed on the $SnO_2$ layer 3, a metal electrode 5 formed on the substrate 1 and a circuit connection, including an ammeter 7 and a reverse bias voltage source 6 connected to both electrodes 4 and 5. A pressure applying needle 10 is so provided that the tip or end thereof is in contact with the surface of the tin oxide layer 3. The pressure applying needle 10 is properly engaged in a known manner with the source of mechanical force or pressure to be measured. As the pressure applying needle 10 was used a glass rod with a radius of curvature at the tip of about 100$\mu$. Alternatively, a rod of other material such as a metal or in a different form may be used.

The thickness of the $SiO_2$ film is chosen to be 15 to 80A, as to be more fully discussed subsequently. Thus it is seen that one of the most specific features of the present invention is to form positively the $SiO_2$ layer between the $SnO_2$ layer and the Si substrate, contrary to expectation in the prior art. The $SnO_2$ layer of the composite is so chosen as to be well conductive and constitutes itself an N-type semiconductor. The conductivity of this $SnO_2$ layer is close to that of a metal, say about $10^{20}$ atoms/cm$^3$ in terms of free electron concentration. The $SnO_2$ layer 3 having the characteristic of N-type semiconductor can be formed by a rapid chemical reaction yielding $SnO_2$. This is presumably acccounted for by the excess of metal or shortage of oxygen resulting from the rapidity of the progress of reaction.

It was discovered that a composite of such structure and composition has a rectifying characteristic and that such composite takes on a photoelectric function when radiation energy is supplied to the heterojunction formed inside the composite. One of possible interpretations of the discovery is that said formation of heterojunction is actually formation of a Schottky barrier between said $SnO_2$ film and the semiconductor substrate, with $SnO_2$ being regarded as a metal.

Referring now to FIG. 2, there is shown a preferred arrangement of apparatus for manufacture of the composite shown in FIG. 1. The apparatus shown comprises a quartz furnace tube 21 surrounded by an electric heater 22, which is capable of controllably heating the reaction zone of the furnace to 400° C to 700° C. Three pipes 11, 18 and 15 are connected to an end wall 25 of the pipe 21. The pipe 11 is used for supplying an oxidizing gas $a$, such as oxygen, air or a mixture of oxygen and nitrogen therethrough into the tube 21 and is connected through a cock 29, a control valve 13 and a flow meter 12 to an oxidizing gas source as indicated as an arrow followed by the character $a$. The pipe 18 is used for supplying a water vapor $f$ therethrough into the tube 21 and is connected through a cock 30 to an evaporator 17, which stores water $e$. The pipe 15 is used for supplying a mixture gas $d$ of a dimethyl tin dichloride vapor $c$ and an inert gas $a'$ therethrough to the tube 21 and is connected through a control valve 16 to an evaporator 14, which stores a liquid $b$ of dimethyl tin dichloride (($CH_3)_2SnCl_2$). Both evaporators 17 and 14 are immersed into oil $h$ housed in an oil bath 19 so that both evaporators may be controllably heated to 110° C to 150° C by a heater (not shown). A pipe 11', connected to the evaporator 14 at one end thereof and partially immersed into the oil $h$ of the oil bath 19, is connected through a cock 29', a control valve 13' and a flow meter 12' to an inert gas source as indicated as an arrow followed by the character $a'$. The other end of the furnace tube 21 is closed with a cap 26 and the gas in the furnace pipe 21 is forced out of an exhaust gas outlet 27 at a given flow rate. A quartz board 23 is placed at a reaction zone of the furnace pipe 21 and a silicon wafer 1, as shown in FIG. 1, is placed on the board 23.

In preparation for manufacture of the composite of the present invention, an N-type silicon wafer 1, as processed physically or chemically so as to provide a mirror-polished or rough main surface, as the case may be, is washed by a diluted solution of hydrogen fluoride (HF) to remove an $SiO_2$ film which might have been formed on the main surface of the wafer 1. The wafer 1 is then placed on the board 23 and is inserted into the quartz furnace tube 21 so that it is positioned at the reaction zone of the tube 21, as shown in FIG. 2. The silicon wafer 1 is then heated by means of the heater 22 up to 400° through 600° C, and preferably to 520° C.

When the said silicon wafer 1 comes to be heated up to the prescribed temperature, the valve 13 and the cocks 29 and 30 are opened, so that the oxidizing gas $a$ and the vapor $F$ are supplied through the pipes 11 and 18, respectively, into the furnace tube 21 to provide an oxidizing atmosphere to the reaction zone. While the silicon wafer 1 is subjected to the oxidizing atmosphere for five minutes, for example, an $SiO_2$ film 2 of 20A in thickness is formed on the surface of the wafer 1, as shown in FIG. 1. The thickness of the $SiO_2$ film is controllably selected as desired within the range of 15 through 80A, for example, as a function of time period in which the wafer 1 is subjected to the said oxidizing atmosphere. However, in implementing an $SiO_2$ film thicker than 50A, the temperature of the furnace tube 21 may be raised to, say 700° C, thereby reducing the time period required for formation of the $SiO_2$ film of desired thickness without a substantial change or quality of the film. Selection of thickness of the SiO$_2$ film will be more fully discussed subsequently.

When the SiO$_2$ film of a desired thickness is formed on the wafer surface, the valve 13' and the cock 29' are also opened, so that an inert carrier gas $a'$ is sent through the pipe 11' to the evaporator 14 which stores dimethyl tin dichloride $b$. As seen from FIG. 2, the inert gas $a'$ is preheated to a certain temperature as it passes through a portion of the pipe 11' immersed into the oil bath 19. The oil bath 19 is heated by means of a heater (not shown), so that the oil h is kept heated to 110° through 150° C and preferably to 135° C. Accordingly, the evaporator 14 is also heated to produce a vapor of dimethyl tin dichloride therein. The vapor of dimethyl tin dichloride filling within the evaporator 14 is carried together as the carrier gas $a'$ passes through the evaporator 14 and a mixture gas $d$ is introduced into the furnace tube 21, pressure of which is usually reduced by means of a vacuum pump (not shown) connected to the exhaust outlet 27. Concurrently with supply of the mixture gas $d$, a water vapor $f$ may also be introduced into the furnace pipe 21, as necessary. It was observed that additional introduction of the water vapor into the furnace tube 21 during deposition of the SnO$_2$ film reduces the time period required for deposition of the SnO$_2$ film of desired thickness without a substantial change of quality of the film.

In the reaction zone, O$_2$ and (CH$_3$)$_2$SnCl$_2$ in the mixed gas $d$ undergo pyrolisis and oxidization reactions, and a film of tin oxide is firmly deposited on the said SiO$_2$ film 2 on the surface of silicon wafter 1. FIG. 1 shows the sectional structure of the SnO$_2$—SiO$_2$—Si composite thus produced.

The process reaction can be described by the following equation:

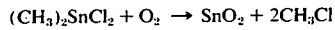

The tin oxide film formed by this method is of high optical transparency, its transmission rate being higher than 80–90% for light of wavelength 400–800 m$\mu$. This film is also highly conductuve. If desired, however, its conductivity can be further enhanced (resistivity diminished) by incorporation of a small amount of antimony trichloride (SbCl$_3$) into the dimethyl tin dichloride solution $b$.

It was discovered that an N-type silicon semiconductor is a suitable material for the substrate of said composite. However, a semiconductor composite of the like rectifying characteristic was also able to be implemented with the use of a P-type silicon semiconductor. In using a P-type material, however, it was found to be preferable to carry out the SnO$_2$ deposition reaction at a somewhat higher temperature or to give a proper heat treatment to the composite made by SnO$_2$ deposition at the reaction temperature mentioned above. It was discovered that composites of a similar rectifying characteristic were also able to be manufactured with Ge or GaAs as a substrate material. It was further observed that Si$_3$N$_4$ or GeO$_2$ may be used in place of SiO$_2$ as an insulating film formed between the SnO$_2$ film and the semiconductor substrate for the purpose of the present invention.

FIG. 3 shows a sectional view of a semiconductor mechanical-electrical transducer of a preferred embodiment of the present invention. The composite shown comprises a film 2' of electrically insulating material such as silicon dioxide of a sufficient thickness, say 0.6$\mu$, formed on a portion of the main surface of the semiconductor substrate 1, another film 2 of the insulating material such as silicon dioxide of 15 to 80A formed on an area of said semiconductor substrate 1 through an opening defined by said film 2' and a tin oxide film further deposited on said films 2 and 2', a rectifying barrier being formed between said semiconductor substrate 1 and the tin oxide film 3. The barrier thus formed is confined by said insulating film 2' and is not exposed and hence a favorable characteristic of the device is ensured.

Now that the structural features of the composite of the present invention have been described, various characteristic features of the composite as a semiconductor device will be hereinafter discussed by referring to various graphs. It is pointed out that such various characteristic features were obtained by using a specific example of the inventive composite comprising an N-type single crystal silicon substrate of 2 mm square and 200$\mu$thick and a tin oxide film of 1 mm and 0.6$\mu$thick.

FIG. 4 is a graph showing a comparison of the characteristic of a pressure sensitive device of an SnO$_2$—SiO$_2$—Si composite structure fabricated in accordance with the present invention with that of a device of an SnO$_2$—Si composite structure fabricated in accordance with the referenced patent. Curve C of FIG. 4 represents the rectifying characteristic of the device of the present invention and curves A and B represent the rectifying characteristic of the prior art device, both in case where no light and mechanical energy is applied to the device. The curve A was obtained using a composite as fabricated so that consideration was taken to eliminate formation of the SiO$_2$ film between the SnO$_2$ film and the Si substrate and the curve B was obtained using a composite as fabricated so that no such particular consideration was taken. As seen from the curves of the graph, a reverse leakage current or dark current of the device of the present invention is much reduced as compared with the prior art device.

Figure 5:
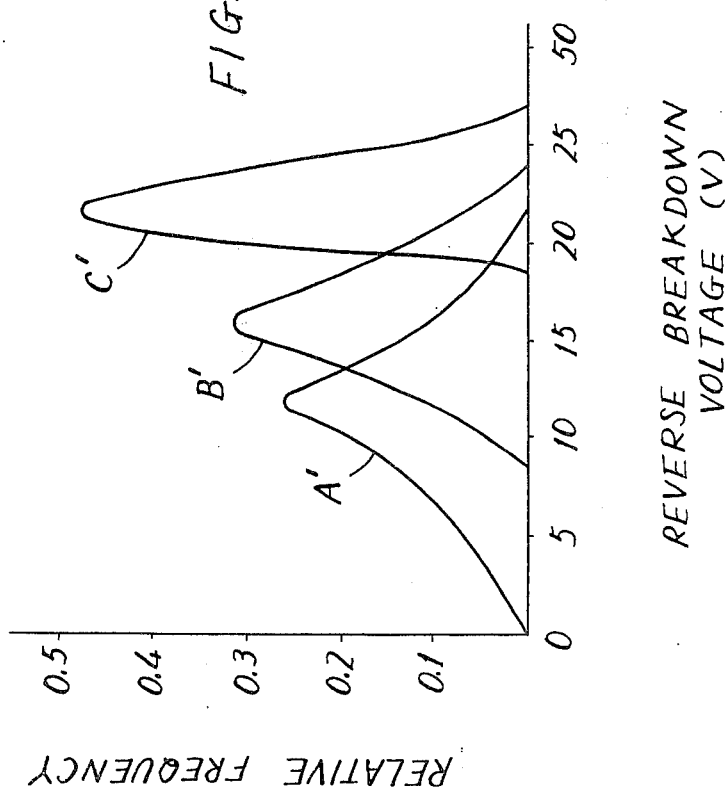
FIG. 5 is a graph showing another comparison in a statistical manner of the characteristic of the semiconductor composite of the present invention with that of the prior art composite.

FIG. 5 is a graph showing another comparison in a statistical manner of the characteristic of the inventive device with that of the referenced prior art device. In the graph, the ordinate represents relative frequency, while the abscissa represents the reverse breakdown voltage. Curve C' of the graph shows a statistical distribution of the reverse breakdown voltage of the inventive device, while curves A' and B' show that of the referenced prior art device. Again, the curve A was obtained using a composite as fabricated so that consideration was taken to eliminate formation of the SiO$_2$ film between the Sno$_2$ film and the Si substrate and the curve B was obtained using a composite as fabricated so that no such particular consideration was taken. As seen from the graph, the devices fabricated in accordance with the present invention are very uniform in the reverse breakdown voltage, whereas such voltage of the referenced prior art devices are widely distributed.

Figure 6:
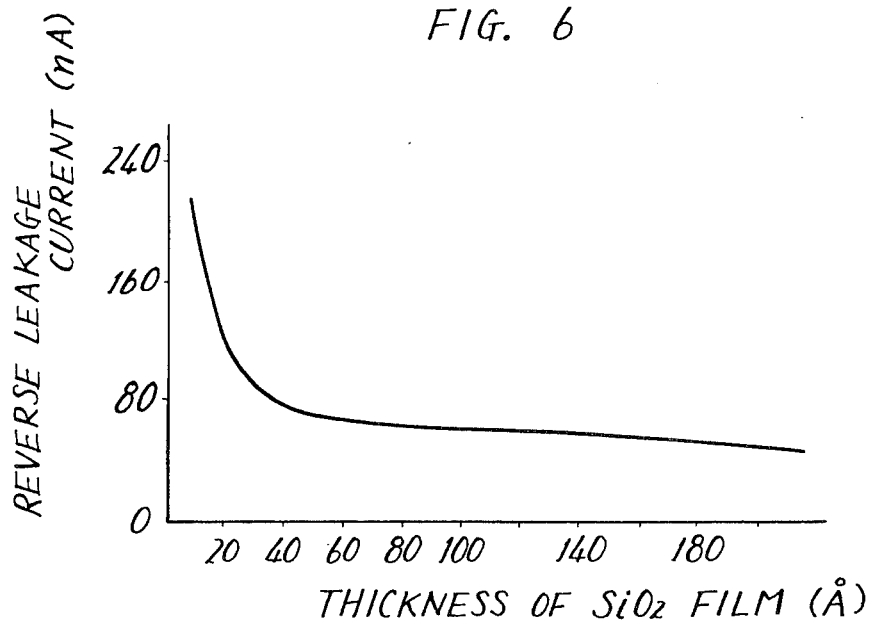
FIG.6 is a graph showing a relation of the reverse leakage current with thickness of the $SiO_2$ film of the composite of the present invention.

FIG. 6 is a graph showing a relation of reverse leakage current versus thickness of the SiO$_2$ film of the inventive devices in case where no light and mechanical energy is applied to the devices. As seen from the graph, the thicker the SiO$_2$ film is formed, the more the reverse leakage current is reduced and, in particular, as the thickness of the SiO$_2$ film is increased from about 20 toward about 60A, the reverse leakage current is rapidly diminished. It was observed that as the thickness of the $SiO_2$ film is increased up to approximately 500A the reverse leakage current is accordingly reduced substantially to zero.

Figure 7:
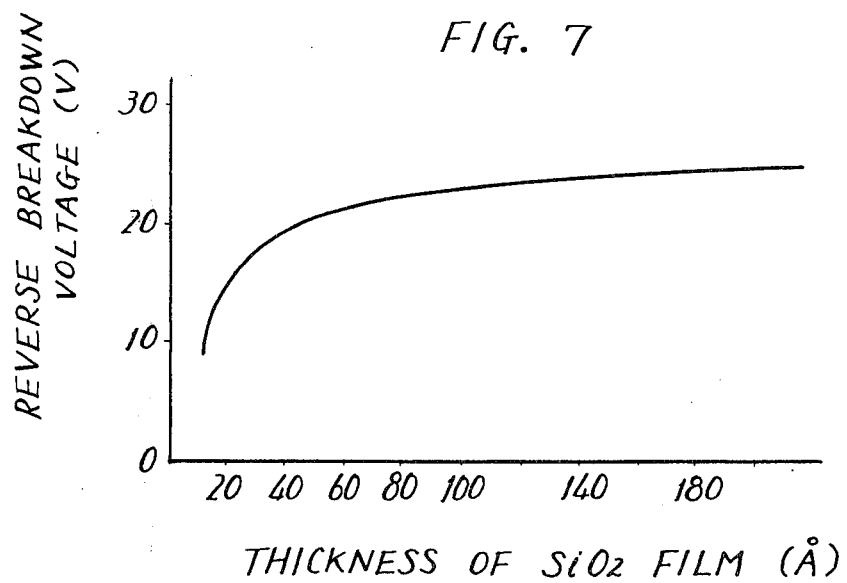
FIG. 7 is a graph showing a relation of the reverse breakdown voltage with thickness of the $SiO_2$ film of the composites of the present invention.

FIG. 7 is a graph showing a relation of the reverse breakdown voltage versus thickness of the $SiO_2$ film of the inventive devices, in case where no light and light energy is applied to the devices. As seen from the FIG. 7 graph, contrary to FIG. 6 graph, the thicker the $SiO_2$ film is formed, the higher the reverse breakdown voltage becomes and likewise as the thickness of the $SiO_2$ film is increased from about 20 toward about 60A, the reverse breakdown voltage becomes rather rapidly higher. It is presumed that the change of the reverse breakdown voltage depending upon the thickness of the $SiO_2$ film results from the fact that the $SiO_2$ layer 2, as the thickness is increased, gradually comes to serve as an insulating film. On the other hand, the $SiO_2$ film of an increased thickness tends to degrade the rectifying characteristic of the device and to lower the photosensitivity of the device.

It is recalled that in the foregoing discussion of the various characteristics and features of the inventive device no pressure has been applied to the device. Surprisingly, however, it was discovered that there exists a roughly linearly proportional relationship between the mechanical force applied by the pressure applying needle 10 to the barrier and the reverse current through the semiconductor composite, when the voltage of the power source 6 is set at a given level. It was further discovered that the inventive device subjected to pressure shows an increased reverse current response of interest in case where the thickness of the $SiO_2$ film has been selected to a particular value range and in particular a ratio of such reverse current of the device subjected to pressure versus that in case of no pressure becomes rapidly remarkable as the thickness of film is increased to a specific value range. The present invention utilizes these phenomena.

Figure 8:
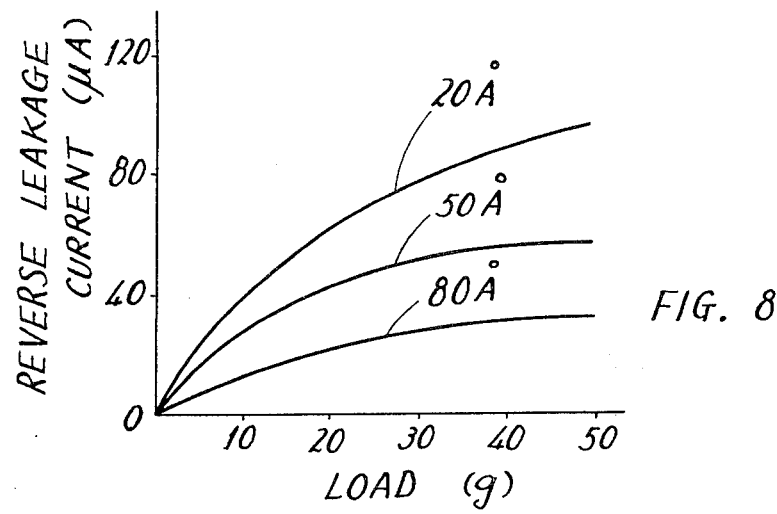
FIG. 8 is a graph showing a mechanical-electrical conversion characteristic of the semiconductor transducer of FIG. 1, with various values of thickness of the $SnO_2$ film as a parameter.

Referring to FIG. 8, there is shown a graph showing a pressure-reverse current characteristic of the transducer of FIG. 1, with various value of thickness of the $SnO_2$ film as a parameter. More particularly, it is a graph showing the pressure-reverse current characteristic of said transducer when a reverse bias of 5 volt is given between the electrodes 4 and 5. As may be apparent from the curves of the graph, the inventive transducer is well satisfactory in sensitivity and has a relatively good linearity. Though it is advisable to have the pressure applying needle 10 set near the centre of the barrier region formed by the substrate 1 and the tin oxide film 3, there is a wide choice of its location. A well stabilized characteristic can be provided in view of the high hardness of the tin oxide film 3, which ensures non-deformation of the film in use for a long period.

As may be apparent from the above explanation, the pressure sensitive device in accordance with the present invention is easy to make, excellent in a pressure sensitive characteristic and, therefore, is highly useful in applications such as an acoustical pick-up.

Figure 9:
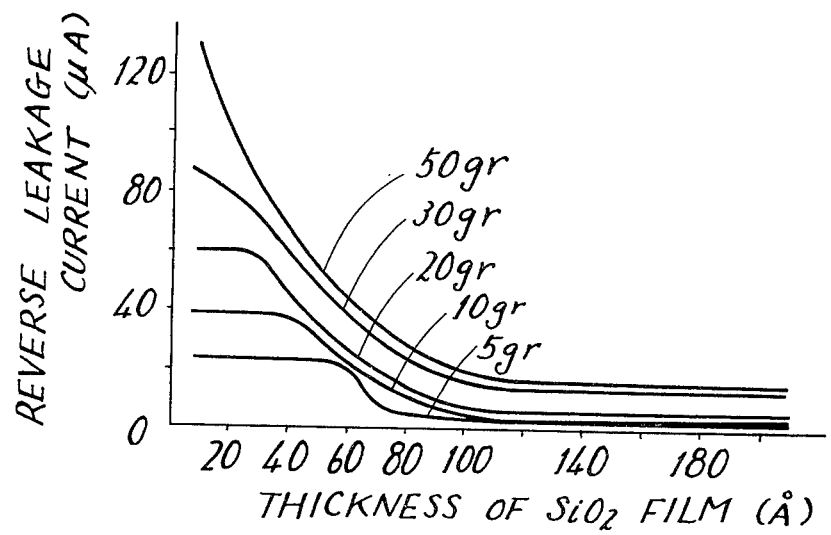
FIG. 9 is a graph showing a relation of a reverse current response with the thickness of the $SiO_2$ of the devices of the present invention, with various values of pressure as a parameter.

FIG. 9 is a graph showing a relation of reverse current response with thickness of the $SiO_2$ film of the inventive device, as supplied with a reverse bias of 5 volt, in case where the device is subjected to pressure, which is changed to various specific values, say 5, 10, 20, 30 and 50 gram, these being shown as a parameter in FIG. 9 graph. The ordinate of the graph indicates a reverse current calculated in terms of $\mu A$, while the abscissa indicates thickness of the $SiO_2$ film. As seen from the graph, the inventive device shows an increased reverse current response, provided that thickness of the $SiO_2$ film is chosen to be smaller than a specific value, say 80A. It is to be noted that the thinner the thickness of $SiO_2$ film is chosen the higher the reverse current becomes and such tendency is remarkable as the pressure is increased.

Figure 10:
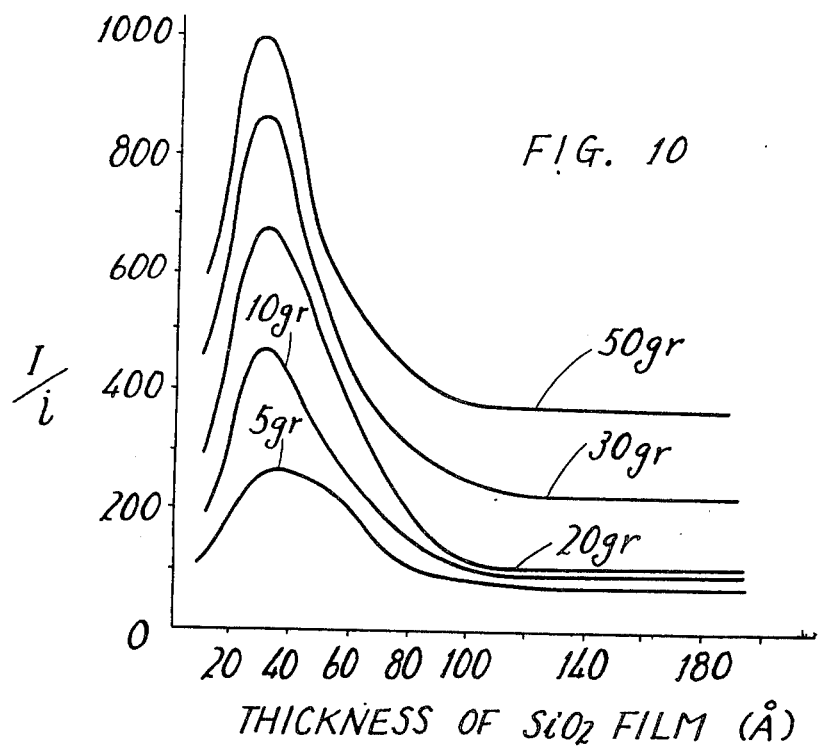
FIG. 10 is a graph showing a relation between a ratio of a reverse current response to pressure versus that in case of no pressure and the thickness of the $SiO_2$ of the devices of the present invention, with various values of pressure as a parameter.

FIG. 10 is a graph showing a relation between a ratio of the reverse current response of the device under pressure versus that in case of no pressure and thickness of the $SiO_2$ film of the device, as supplied with a reverse bias of 5 volt, with various values of pressure, say 5, 10, 20, 30, 40 and 50 gram, being shown as a parameter. The ordinate of the graph indicates a ratio of the reverse current response of the device under pressure versus that in case of no pressure applied thereto, while the abscissa indicates thickness of the $SiO_2$ film. As seen from the graph, the inventive device shows an improved pressure-no pressure ratio characteristic, provided that the thickness of $SnO_2$ film is chosen to be in a specific range of value, say 15 to 80A generally, and 20 to 40A particularly.

It is recalled that the fact was pointed out with reference to FIGS. 6 and 7 that as the thickness of the $SiO_2$ film is increased from about 20 toward about 60A the reverse leakage current is rapidly diminished and the reverse breakdown voltage becomes rather rapidly higher. Taking into consideration the abovementioned facts, it is preferred to chose the thickness of the $SiO_2$ film to be about 15 to 80A and it is more preferred to chose it to be about 15 to 60A, or about 20 to 60A, and most preferably, to be 20 to 40A for the purpose of the present invention.

In the foregoing description as to a manufacturing process of the inventive device by referring to FIG. 2, the $SiO_2$ layer as formed in the natural condition was completely removed by using a solution including hydrogen fluoride, before the $SiO_2$ layer is formed subsequently for the purpose of the present invention. The reason for removing the $SiO_2$ layer as formed in the natural condition is to facilitate controlling of the thickness of the $SiO_2$ film formed for the purpose of the present invention. More specifically, in general the thickness of the $SiO_2$ layer as formed in the natural condition of a silicon wafer prepared for manufacture of the inventive device is different or is not uniform depending upon the lapse of time since the wafer is cut and mirror-polished, environmental conditions in which the wafer is placed, etc. Therefore, formation of the $SiO_2$ film on the wafer for the purpose of the present invention in addition to and under the $SiO_2$ layer as formed in the natural condition makes the resultant $SiO_2$ film uneven in thickness and in quality, resulting in lack of uniformity of the reverse voltage characteristic, leakage current, reverse breakdown voltage, etc. By contrast, the abovementioned pretreatment for removal of the undesired $SiO_2$ layer eliminates such a problem and improves the yield rate of manufacture. However, the $SiO_2$ layer as naturally formed need not be necessarily removed completely. If the layer of even thickness is left behind as a result of the said pretreatment, such film may be used as a portion of the $SiO_2$ layer subsequently formed for the purpose of the present invention by properly controlling the oxidization condition by the oxidizing gas a, such as a temperature and a time period for oxidization.

Figure 11:
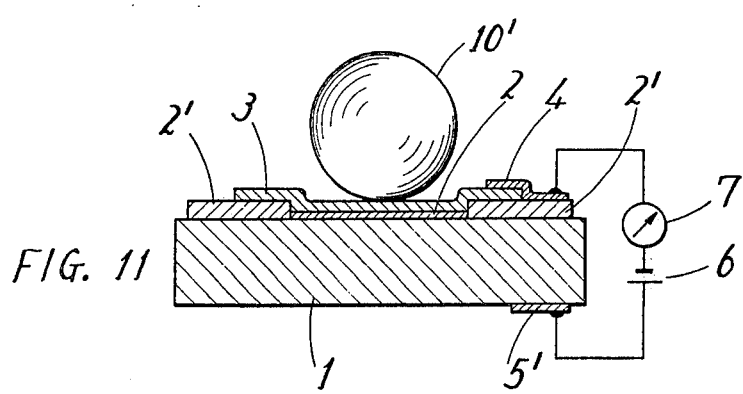
FIG. 11 is a sectional view of a semiconductor transducer of another embodiment in accordance with the present invention.

Referring to FIG. 11, there is shown a sectional view of a transducer of another embodiment in accordance with the present invention, wherein a pressure applying ball 10' is used in place of the pressure applying needle 10. As may be seen from FIG. 1, with a pressure applying needle 10 the pressure to which the barrier is subjected may vary according to the direction of vector of the mechanical force applied to the pressure applying needle 10. According to the embodiment of FIG. 11, however, the pressure applying ball 10' is allowed to roll and hence the pressure can be applied vertically to the surface of tin oxide layer where the ball comes into contact with the tin oxide surface even if the direction of the mechanical force applied to the pressure applying ball 10' is not vertical to the tin oxide surface.

The characteristic shown in FIG. 8 was that of the embodiment in which the surface of the substrate of the semiconductor composite of the transducer of FIG. 1 was mirror-polished. In fact, in case of the semiconductor composite disclosed in the referenced application, mirror-polishing of the surface of the substrate was considered desirable. It was, however, discovered that in the light of the purpose of the present invention it is preferable to leave the substrate surface of the inventive transducer rough or uneven. The following is a detailed description of such an embodiment of the present invention.

Figure 12:
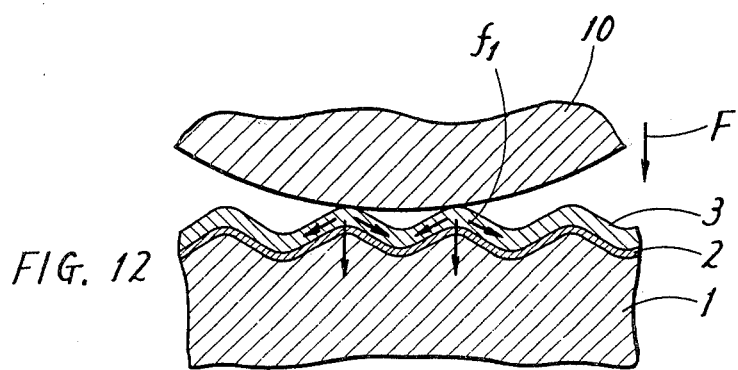
FIG. 12 is an enlarged sectional view of a portion where the pressure applying means is in contact with the semiconductor composite of still another embodiment in accordance with the present invention.

Referring to FIG. 12, there is shown an illustrative enlarged sectional view of the pressure applying needle contact area of such an embodiment where the substrate surface of the transducer of FIG. 1 is left rough or uneven. A main surface of the semiconductor substrate 1 is full of surface irregularities and the silicon dioxide film 2 and the tin oxide film 3 are deposited over this uneven surface. Therefore, when a proper pressure applying member such as the presence applying needle 10 with a radius of curvature at the tip of 300μ is allowed to press on the tin oxide film 3, the pressure applying needle 10 partially comes into contact with protruded portions of the tin oxide film 3. When a load is applied to pressure applying needle 10, a mechanical strain is caused in a part of the tin oxide film 3 and the semiconductor substrate 1, and this strain has influence on the abovementioned barrier, which can be detected as a change of reverse current through the barrier by means of a suitable detective means such as the ammeter 7 connected in series with the reverse bias power source 6, as illustrated in FIG. 1.

It was discovered that the pressure sensitive device of the embodiment of FIG. 12, in which the abovementioned construction is employed, was distinguished for its remarkably improved pressure sensitive characteristic.

Figure 13:
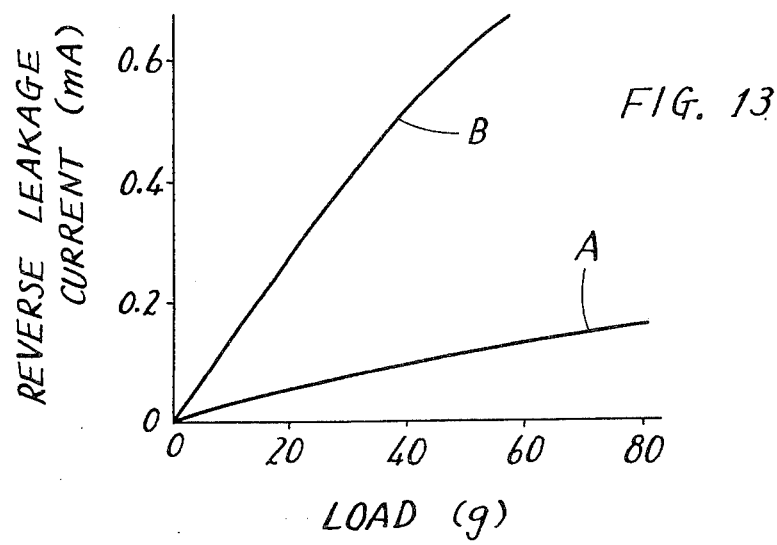
FIG. 13 is a graph showing comparison of the mechanical-electrical conversion characteristic of the transducer of FIG. 12 embodiment with that of FIG. 1 embodiment.

FIG. 13 is a graph showing a change of the reverse current against the load applied as determined with the embodiment of FIG. 12, in which thickness of the $SnO_2$ film has been chosen to be 20A. In this graph, Curve A is a characteristic curve of the pressure sensitive device of the embodiment with the substrate surface mirror-polished which was referred to above in connection with FIG. 1, while Curve B is that showing a characteristic of the pressure sensitive device of the embodiment of FIG. 12.

With the pressure sensitive device of the embodiment with its substrate surface mirror-polished, the silicon dioxide film and the tin oxide film were deposited on the mirror-polished main surface of semiconductur substrate such as normally employed in a common semiconductor device like a diffusion-type transistor. On the contrary, no complicated process is required for providing unevenness on the semiconductor substrate such as of the embodiment of FIG. 12.

While normally the semiconductor substrate used in a diffusion type semiconductor device is mirror-polished after lapping, the semiconductor substrate for the embodiment of FIG. 12 can be prepared without said mirror-polishing. Alternatively, it may be mirror-polished and then subjected to chemical etching for providing unevenness of the surface thereof. The surface of the semiconductor substrate thus prepared has many small concaves and convexes to a depth or height of about 1 micron and spaced apart several microns from each other. A chromium-plated needle was used as the pressure applying needle 10 and the abovementioned characteristic was obtained with the reverse bias voltage of 5 V.

Such a remarkable difference in pressure sensitive characteristic as shown in FIG. 13 is attributable to the difference in a surface condition of the substrate on which the tin oxide film is deposited. The reason may be explained as follows.

It is presumed that the load applied gives rise to a shearing stress in the barrier region of the composite, this shearing stress affecting the rectifying barrier. Referring to FIG. 12, load F applied to the pressure applying needle 10 causes a component $f_1$ of the force to act along with a direction of a bevel of the tin oxide film 3, this giving rise to a shearing stress in the barrier in the bevel portion. This shearing stress is more important than the compressive stress vertical to the barrier in respect of influence on the barrier. One of the reasons may be accounted for by, among others, the fact that shearing modulus is smaller than Young's modulus. The relationship between shearing modulus N and Young's modulus E is expressed as follows:

$$N = \frac{E}{2(1+K)}$$

where K is a Poisson's ratio, which is normally about 0.3 for metals and the like. Therefore, the shearing modulus is only about 0.4 times that of Young's modulus. This means that under a given load, deformation by shearing is more than that by compression. Another reason lies in the fact that the semiconductor composite contained in the transducer of the present invention comprises the heterojunction between two different kinds of materials such as semiconductor and tin oxide. The tin oxide film 3 is deposited through pyrolysis on the semiconductor substrate 1. Hence, the mechanical adherence of the film to the substrate is not so strong as in the case of a junction between the same materials. Moreover, the semiconductor substrate 1 and the tin oxide film 3 are sufficiently hard and small in shearing modulus. Therefore, when the component $f_1$ of force is allowed to be applied to the tin oxide film 3 along the direction of a bevel, shearing takes place between the tin oxide film 3 and the semiconductor substrate 1 without being accompanied by deformation of the tin oxide film 3 and the semiconductor substrate 1, this influencing the rectifying barrier. As will be described later, the slope of the bevel of the irregularities or unevenness in the surface of the semiconductor substrate 1 is so gradual that the component $f_1$ of load F which acts along the direction of the bevel of the tin oxide film 3 is presumed to be rather small. Nevertheless, a remarkable improvement in pressure sensitive characteristic can be achieved with such a minute component $f_1$ of force. This fact substantiates the usefulness of the present invention. Thus, it is seen that the said latter reason is more significant. Generally speaking, it is difficult to provide sharp irregularities in the surface of the semiconductor substrate. For instance, by employing a common method of selective chemical etching for making grooves on the substrate, the largest possible angle of the groove wall or bevel to the main surface of the substrate is only 30°–45°. Even if sharper irregularities could be provided by some other means, it is difficult to have the tin oxide film deposited by pyrolysis on such steep walls of grooves.

As will be apparent from the above description, the semiconductor pressue sensitive device of the embodiment of FIG. 12 makes good use of the heterojunction between the semiconductor substrate and the tin oxide film so that the said junction is subjected to shearing stress by adoption of such a construction that force as a component of the load applied is allowed to act in the extending direction of the tin oxide film. Such transducer is simple in construction and easy to manufacture.

Figure 14:
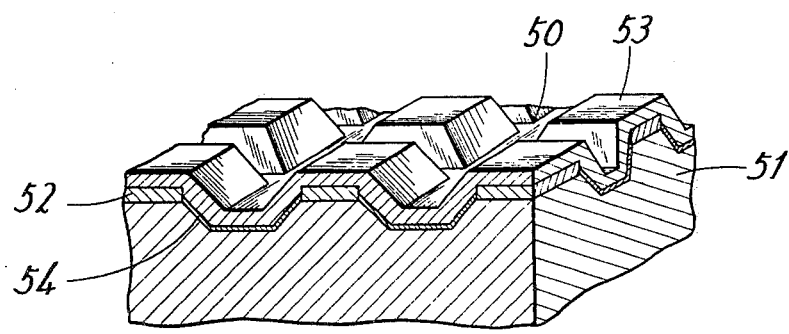
FIG. 14 is an enlarged perspective view of a fragmentary part of the transducer of still a further embodiment in accordance with the present invention.

FIG. 14 is an enlarged perspective view of a fragmentary part of another embodiment of the present invention similar to the embodiment of FIG. 12. Referring to FIG. 14, grooves 50 are formed latticewise on the main surface of a semiconductor substrate 51 and on the outermost plane surface other than the grooves 50 is deposited in insulating film 52. A silicon dioxide film 54 and a tin oxide film 53 are then deposited all over the main surface of the substrate including the grooves 50 and the insulating film 52. The grooves 50 may, as mentioned above, be easily formed by chemical etching. The insulating film 52 may, for example, be a film of silicon nitrie. When silicon nitrode film is employed, it may be utilized as a mask for selective formation by etching of the grooves 50. In this embodiment the insulating film 52 is sandwiched so as not to provide the heterojunction just where shearing stress does not take place, or compressive stress takes place. In view of this the proportion of the shearing stress area to the entire area of the heterojunction is enhanced, this resulting in further improvement of the pressure sensitive characteristic.

Figure 16:
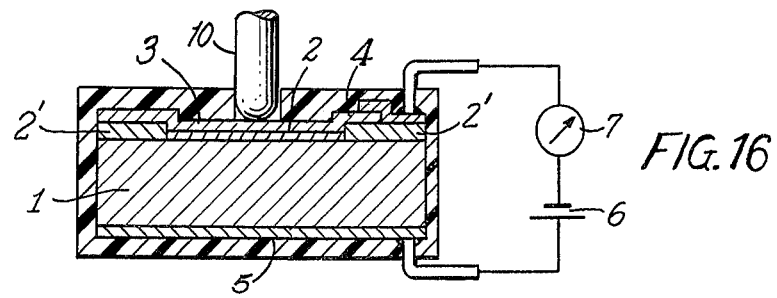
FIG. 16 is a sectional view of a semiconductor transducer in accordance with the present invention enclosed within a housing.

Now referring again to FIG. 1, it is understood that the embodiment shown therein has the electrode 4 formed only over the peripheral portion of the tin oxide film 3. Usually, the semiconductor composite of the present invention is housed in a suitable package, so that the barrier of the semiconductor composite employed in the transducer of FIG. 1 may not be exposed to undersired incidental light. FIG. 16 shows an illustrative housing 100 of opaque material for housing the electrical-mechanical transducer as shown in FIG. 3 for avoiding exposure of the transistor to undesired, incidental light. However, in view of the above-mentioned various characteristics of the inventive composite, the semiconductor composite contained in the transducer of FIG. 1 can be used as a desirable photoelectric device. Hence, by so adapting the transducer shown in FIG. 1 that light is applied to said barrier through the tin oxide film, a semiconductive transducer converting light energy as well as mechanical force into electrical energy is provided. Such novel transducer may provide new applications.

In some applications, however, an unpackaged transducer which is not sensitive to incidental light but responsive only to mechanical force, may be called for. In such cases it is even necessary to avoid influence of light from outside on the pressure sensitive characteristic of the transducer.

Figure 15:
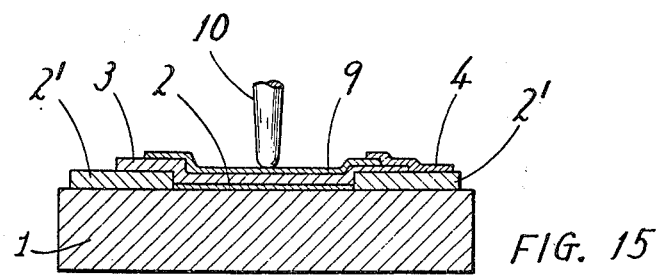
FIG. 15 is a sectional view of a semiconductor transducer of still a further embodiment in accordance with the present invention.

FIG. 15 is a sectional view of the transducer of a further embodiment of the present invention intended for such purpose. Referring to FIG. 15, an opaque protective film 9 of e.g. nickel is deposited on the tin oxide layer 3 so as to be in contact with the electrode 4. Since the incidental light directed to the barrier is screened by the protective film 9, it is not necessary to have the entire device shown housed in a casing made of opaque material. The protective nickel film 9 also serves as an electrode. Nickel, however, is low in hardness and hence when load is applied by means of the pressure applying member, it undergoes plastic deformation, this resulting in an unstabilized pressure sensitive characteristic. Therefore, it is advisable to choose a material of high strength for the light screen. As such a material for the thin film 21 meeting the abovementioned requirement molybdenum, tungsten, platinum and chromium may be recommended. This film must be thick enough to effect screening of light, but is desired to be as thin as possible, the recommended thickness being, for instance, $0.1\mu$ or so. Alternatively, a layer of metal oxide such as alumina may be used. The abovementioned thin film 9 which acts as a screen against the incidental light also serves for protection against damage to the tin oxide layer or barrier as incurred by the pressure applying needle.

It should be pointed out that in all the abovementioned embodiments a semiconductor substrate having the main surface of crystallographic plane (111) was used. The inventors of the present application made investigation of a relation between crystallographic plane of the main surface of the substrate and the pressure sensitivity and stability of the characteristic of the resultant device. As a result, it was observed that the crystallographic plane of the substrate surface has no substantial influence upon the pressure sensitivity and the stability of the characteristic, so far as the inventive device comprising a semiconductor composite having the SiO₂ and SnO₂ layers deposited on an uneven main surface is concerned. On the contrary, it was observed that the pressure sensitivity and stability of the characteristic of the device having the SiO₂ and SnO₂ layers deposited on the mirror-polished main surface of the substrate depends upon the crystallographic plane of the substrate surface. More specifically, a transducer comprising a polished composite using the (100) plane is superior to a transducer comprising a composite using the (111) plane in pressure sensitivity, and the former is much more stabilized as compared with the latter in the reverse leakage current characteristic against repeated application of pressure to the device. Accordingly, it is preferred to employ a substrate having a main surface of the (100) plane, in case of implementing the inventive transducer comprising a composite using a substrate of a mirror-polished surface.

A further investigation was made of a relation between the specific resistivity of the substrate and the pressure sensitivity and the stability of the characteristic of the resultant device. As a result, it was observed that the higher the specific resistivity of the substrate is chosen, the less the pressure sensitivity becomes but the more the reverse leakage current characteristic is stabilized. An exemplary embodiment of the inventive device employing the substrate of 10 ohm cm in specific resitivity showed a remarkable improvement in stability of the reverse leakage current characteristic against repeated application of pressure to the device, although the pressure sensitivity was slightly decreased. Thus it is more preferred to employ a substrate of increased specific resistivity and having a surface of the (100) plane, in case of implementing the inventive transducer comprising a composite including a substrate of mirror-polished main surface.

While specific preferred embodiments of the invention have been described, it will be apparent that obvious variations and modifications of the invention will occur to those of ordinary skill in the art from a consideration of the foregoing description. It is therefore desired that the present invention be limited only by the appended claims.

What is claimed is:

1. A semiconductor mechanical-electrical transducer comprising:
    a semiconductor composite including a semiconductor substrate having a main surface,
    a first insulating material film of substantial thickness formed on a portion of the main surface of said substrate and defining an exposed portion of said substrate,
    a second insulating material layer deposited on said exposed portion of said main surface of said substrate defined by said first insulating material film, said second insulating material layer consisting essentially of $SiO_2$ and being approximately 15 to 80 A in thickness,
    a tin oxide layer deposited on said second insulating material layer,
    said semiconductor composite having a barrier portion defined by said substrate, said second insulating material layer and said tin oxide layer having a rectifying characteristic, and
    means for applying mechanical force to said barrier portion of said composite, said composite exhibiting an increased ratio of reverse current therethrough in response to an applied mechanical force relative to the level of reverse current in the absence of an applied mechanical force.

2. The semiconductor mechanical-electrical transducer in accordance with claim 1, in which the thickness of the second insulating material layer is so chosen that the reverse leakage current is diminished and the reverse breakdown voltage is raised.

3. The semiconductor mechanical-electrical transducer in accordance with claim 2, in which the thickness of the second insulating material layer is so chosen that the pressure sensitivity is enhanced.

4. The semiconductor mechanical-electrical transducer in accordance with claim 1, in which said semiconductor substrate is a member selected from the group consisting of Si, Ge and GaAs.

5. The semiconductor mechanical-electrical transducer in accordance with claim 1, in which said semiconductor substrate is Si.

6. The semiconductor mechanical-electrical transducer in accordance with claim 1, in which said semiconductor substrate in N-type conductivity Si.

7. The semiconductor mechanical-electrical transducer in accordance with claim 1, in which the thickness of the said second insulating material layer is chosen to be approximately 15 to 60A.

8. The semiconductor mechanical-electrical transducer in accordance with claim 1, in which the thickness of the said second insulating material layer is chosen to be approximately 20 to 60A.

9. The semiconductor mechanical-electrical transducer in accordance with claim 1, in which the thickness of the said second insulating material layer is chosen to be approximately 20 to 40A.

10. The semiconductor mechanical-electrical transducer in accordance with claim 1, which further comprises a voltage source for supplying a reverse bias between said tin oxide layer and said semiconductor substrate in a reverse direction with respect to the rectifying characteristic of the composite.

11. The semiconductor mechanical-electrical transducer in accordance with claim 1, in which said mechanical applying means is in a form of a rod, an end of which is in contact with said tin oxide layer.

12. The semiconductor mechanical-electrical transducer in accordance with claim 1, in which said mechanical force applying means is in a form of a ball, a portion of which is in contact with said tin oxide layer.

13. The semiconductor mechanical-electrical transducer in accordance with claim 1, in which
    said semiconductor substrate has an uneven main surface, and
    said second insulating material layer and said tin oxide layer are deposited on said uneven main surface so as to form an uneven heterojunction barrier having a rectifying characteristic, whereby force exerted against said barrier surface produces a shearing stress in the heterojunction.

14. The semiconductor mechanical-electrical transducer in accordance with claim 13, in which said main surface of the substrate has a plurality of grooves therein rendering it uneven, wherein:
    said first insulating layer of substantial thickness is deposited on the portions of said main surface exclusive of the grooves, and
    said tin oxide film is deposited on both said first insulating layer and on sid second insulating layer on the grooves in the main surface of the substrate,
    whereby a heterojunction barrier having a rectifying characteristic is formed within each of the grooves in the substrate.

15. The semiconductor mechanical-electrical transducer in accordance with claim 13, in which the main surface of the substrate comprises natural surface irregularities unaltered by polishing.

16. The semiconductor mechanical-electrical transducer in accordance with claim 13, in which the main surface of the substrate comprises a lapped but unpolished surface.

17. The semiconductor mechanical-electrical transducer in accordance with claim 16, in which the means for applying mechanical force comprises a pressure applying needle having a radius of curvature at the tip of about 100 microns.

18. The semiconductor mechanical-electrical transducer in accordance with claim 13, in which the main surface of the substrate comprises a polished semiconductor surface, made uneven by chemical etching.

19. The semiconductor mechanical-electrical transducer in accordance with claim 1, in which
    said semiconductor substrate has a main surface of the crystallographic plane (111), and
    said second insulating material layer and said tin oxide layer are deposited on said main surface so as to form a heterojunction barrier having a rectifying characteristic.

20. The semiconductor mechanical-electrical transducer in accordance with claim 1, in which
said semiconductor substrate has a main surface of the crystallographic plane (100), and
said second insulating material layer and said tin oxide layer are deposited on said main surface so as to form a heterojunction barrier having a rectifying characteristic.

21. The semiconductor mechanical-electrical transducer in accordance with claim 1, which further comprises a protection film deposited on said tin oxide layer.

22. The semiconductor mechanical-electrical transducer in accordance with claim 21, in which said protection film is opaque.

23. The semiconductor mechanical-electrical transducer in accordance with claim 1, which further comprises a package for housing said semiconductor composite.

24. The semiconductor mechanical-electrical transducer in accordance with claim 23, in which said package is so adapted that incidental light is screened from impinging upon the semiconductor composite.

25. A semiconductive mechanical-electrical transducer comprising:
a semiconductor composite including a semiconductor substrate formed of Si, Ge, or GaAs; and a tin oxide film overlying said semiconductor substrate and forming a barrier having a rectifying characteristic therebetween; and
means for applying mechanical force to said composite;
the improvement which comprises:
a thin intermediate insulating layer of $SiO_2$ uniformly deposited between said semiconductor substrate and said tin oxide film, said insulating layer having a thickness of about 15 to 80A.

26. The transducer of claim 24 wherein said semiconductor substrate consists essentially of N-type Si.

27. The transducer of claim 26 which includes
means for applying a reverse bias voltage to said semiconductor composite; and
means for measuring reverse current to determine a ratio of said reverse current with said composite under mechanical force to said reverse current with said composite under no mechanical force, whereby said ratio is increased with increased mechanical force.

28. The device of claim 27 wherein said semiconductor substrate has an uneven surface and said insulating layer and tin oxide film or formed on said uneven surface to provide an uneven barrier, whereby force exerted on said uneven barrier produces a shearing stress in said barrier.

29. A transducer as recited in claim 1 in which said substrate is silicon.

30. A transducer as recited in claim 29 in which said substrate is N-type silicon.

* * * * *

UNITED STATES PATENT AND TRADEMARK OFFICE
CERTIFICATE OF CORRECTION

PATENT NO. : 4,011,577
DATED : March 8, 1977
INVENTOR(S) : Shigeru Tanimura et al.

It is certified that error appears in the above-identified patent and that said Letters Patent are hereby corrected as shown below:

```
Column  2, line 61, "This" should be --Thus--.
Column  4, line  5, "protion" should be --portion--.
Column  5, line 32, "sutstrate" should be --substrate--.
Column  6, line 55, "F" should be --f--.
Column  7, line 43, "conductuve" should be --conductive--.
Column 11, line 67, "semiconductur" should be --semiconductor--.
Column 13, line 17, "pressue" should be --pressure--.
Column 13, line 38, "nitrie" should be --nitride--.
Column 13, line 38, "nitrode" should be --nitride--.
Column 13, line 55, "undersired" should be --undesired--.
Column 15, line 64, "in" should be --is--.
Column 16, line 41, "sid" should be --said--.
Column 18, line 23, "or" should be --are--.
```

Signed and Sealed this

Seventh Day of June 1977

[SEAL]

Attest:

RUTH C. MASON
Attesting Officer

C. MARSHALL DANN
Commissioner of Patents and Trademarks